United States Patent
Geng et al.

(10) Patent No.: US 10,997,887 B2
(45) Date of Patent: May 4, 2021

(54) SIGNAL ADJUSTMENT METHOD, SIGNAL ADJUSTMENT CIRCUIT AND IMAGE PROCESSING CIRCUIT

(71) Applicant: BOE TECHNOLOGY GROUP CO., LTD., Beijing (CN)

(72) Inventors: Lihua Geng, Beijing (CN); Xitong Ma, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 114 days.

(21) Appl. No.: 16/550,416

(22) Filed: Aug. 26, 2019

(65) Prior Publication Data
US 2020/0312210 A1 Oct. 1, 2020

(30) Foreign Application Priority Data
Mar. 28, 2019 (CN) .......... 201910244986.X

(51) Int. Cl.
*G09G 3/20* (2006.01)
*G09G 3/36* (2006.01)
*G09G 5/10* (2006.01)
*H03K 5/24* (2006.01)
*H03K 5/00* (2006.01)
*G09G 5/00* (2006.01)

(52) U.S. Cl.
CPC .......... *G09G 3/20* (2013.01); *H03K 5/24* (2013.01); *G09G 5/008* (2013.01); *G09G 2320/0242* (2013.01); *G09G 2320/0247* (2013.01); *H03K 2005/00078* (2013.01)

(58) Field of Classification Search
None
See application file for complete search history.

(56) References Cited

U.S. PATENT DOCUMENTS 10,217,393 B2 * 2/2019 Noh .............. G09G 3/2003

* cited by examiner

*Primary Examiner* — Kenneth B Wells

(57) ABSTRACT

A signal adjustment method, a signal adjustment circuit, an image processing circuit and a display device are disclosed. The signal adjustment method is used for adjusting a display signal including an original clock signal and an original data signal, and the method includes: delaying the original clock signal by a first delay amount to obtain a reference clock signal; delaying the original data signal by a second delay amount to obtain a reference data signal; sampling the reference data signal with the reference clock signal to obtain a sampled data; comparing the sampled data with a reference data to obtain a comparison result; and adjusting a reference timing relationship according to the comparison result, and the reference timing relationship is a timing relationship between the reference clock signal and the reference data signal.

20 Claims, 9 Drawing Sheets output correct sampled data output wrong sampled data

SIGNAL ADJUSTMENT METHOD, SIGNAL ADJUSTMENT CIRCUIT AND IMAGE PROCESSING CIRCUIT

The application claims priority to Chinese Patent Application No. 201910244986.X, filed on Mar. 28, 2019, the entire disclosure of which is incorporated herein by reference as part of the present application.

TECHNICAL FIELD

At least one embodiment of the present disclosure relates to a signal adjustment method, a signal adjustment circuit and an image processing circuit.

BACKGROUND

When sampling a data signal by using a clock signal, in order to realize a correct sample, a certain timing relationship must be satisfied between the clock signal and the data signal. For example, when the data signal is sampled by using a rising edge or a falling edge of the clock signal, a sampling timing is required to occur during a window period when the data signal is stable (for example, the data signal remains unchanged).

SUMMARY

At least one embodiment of the present disclosure provides a signal adjustment method for adjusting a display signal comprising an original clock signal and an original data signal, and the method comprises: delaying the original clock signal by a first delay amount to obtain a reference clock signal; delaying the original data signal by a second delay amount to obtain a reference data signal; sampling the reference data signal with the reference clock signal to obtain a sampled data; comparing the sampled data with a reference data to obtain a comparison result; and adjusting a reference timing relationship according to the comparison result, and the reference timing relationship is a timing relationship between the reference clock signal and the reference data signal.

For example, in a signal adjustment method provided by an embodiment of the present disclosure, adjusting the reference timing relationship according to the comparison result comprises: keeping the second delay amount unchanged, and determining whether the first delay amount needs to be adjusted according to the comparison result.

For example, in a signal adjustment method provided by an embodiment of the present disclosure, determining whether the first delay amount needs to be adjusted according to the comparison result comprises: in a case where the sampled data is different from the reference data, increasing the first delay amount; and in a case where the sampled data is same as the reference data, storing the first delay amount at this moment as a clock target delay amount, and stopping adjusting the first delay amount.

For example, in a signal adjustment method provided by an embodiment of the present disclosure, the first delay amount and the second delay amount are both zero when the signal adjustment method is initially implemented.

For example, in a signal adjustment method provided by an embodiment of the present disclosure, comparing the sampled data with the reference data to obtain the comparison result comprises: comparing the sampled data and the reference data one by one according to data bits, and performing an OR operation on comparison results of all the data bits to obtain the comparison result.

For example, in a signal adjustment method provided by an embodiment of the present disclosure, adjusting the reference timing relationship according to the comparison result comprises: keeping the first delay amount unchanged, and determining whether the second delay amount needs to be adjusted according to the comparison result.

For example, in a signal adjustment method provided by an embodiment of the present disclosure, the original data signal comprises a plurality of data bits, and for each of the data bits, determining whether the second delay amount needs to be adjusted according to the comparison result comprises: in a case where the sampled data is different from the reference data, increasing or decreasing the second delay amount; and in a case where the sampled data is same as the reference data, storing the second delay amount at this moment as a data target delay amount corresponding to the each of the data bits and stopping adjusting the second delay amount corresponding to the each of the data bits.

For example, in a signal adjustment method provided by an embodiment of the present disclosure, increasing or decreasing the second delay amount comprises: increasing or decreasing the second delay amount by a minimum delay amount.

For example, in a signal adjustment method provided by an embodiment of the present disclosure, the minimum delay amount is an integer multiple of one nanosecond.

For example, in a signal adjustment method provided by an embodiment of the present disclosure, the first delay amount and the second delay amount are both an integer multiple of the minimum delay amount when the signal adjustment method is initially implemented.

For example, in a signal adjustment method provided by an embodiment of the present disclosure, if the sampled data is different from the reference data all time, an adjustment direction of the second delay amount is changed.

For example, a signal adjustment method provided by an embodiment of the present disclosure further comprises: modifying the sampled data according to the comparison result to remind a user of an erroneous pixel that has a data error.

For example, in a signal adjustment method provided by an embodiment of the present disclosure, modifying the sampled data according to the comparison result comprises: setting all data bits corresponding to the erroneous pixel to 1 or 0.

For example, in a signal adjustment method provided by an embodiment of the present disclosure, modifying the sampled data according to the comparison result comprises: modifying sampled data corresponding to pixels around the erroneous pixel to form an auxiliary frame, wherein the erroneous pixel is located in the auxiliary frame.

At least one embodiment of the present disclosure provides a signal adjustment circuit used for adjusting a display signal comprising an original clock signal and an original data signal, and the signal adjustment circuit comprises a first delay circuit, a second delay circuit, a data sampling circuit, a data comparison circuit and a delay adjustment circuit. The first delay circuit is configured to delay the original clock signal by a first delay amount to obtain a reference clock signal; the second delay circuit is configured to delay the original data signal by a second delay amount to obtain a reference data signal; the data sampling circuit is configured to sample the reference data signal with the reference clock signal to obtain a sampled data; the data comparison circuit is configured to compare the sampled data with a reference data to obtain a comparison result; and the delay adjustment circuit is configured to adjust a reference timing relationship according to the comparison result, and the reference timing relationship is a timing relationship between the reference clock signal and the reference data signal.

For example, in a signal adjustment circuit provided by an embodiment of the present disclosure, the delay adjustment circuit is configured to keep the second delay amount unchanged and determine whether the first delay amount needs to be adjusted according to the comparison result.

For example, in a signal adjustment circuit provided by an embodiment of the present disclosure, the delay adjustment circuit is configured to, in a case where the sampled data is different from the reference data, increase the first delay amount; and in a case where the sampled data is same as the reference data, store the first delay amount at this moment as a clock target delay amount and stop adjusting the first delay amount.

For example, in a signal adjustment circuit provided by an embodiment of the present disclosure, the delay adjustment circuit is configured to keep the first delay amount unchanged and determine whether the second delay amount needs to be adjusted according to the comparison result.

For example, in a signal adjustment circuit provided by an embodiment of the present disclosure, the original data signal comprises a plurality of data bits, and for each of the data bits, the delay adjustment circuit is configured to, in a case where the sampled data is different from the reference data, increase or decrease the second delay amount; and in a case where the sampled data is same as the reference data, store the second delay amount at this moment as a data target delay amount corresponding to the each of the data bits and stop adjusting the second delay amount corresponding to the each of the data bits.

For example, a signal adjustment circuit provided by an embodiment of the present disclosure further comprises a noise calibration circuit, and the noise calibration circuit is configured to modify the sampled data according to the comparison result to remind a user of an erroneous pixel that has a data error.

For example, in a signal adjustment circuit provided by an embodiment of the present disclosure, the noise calibration circuit is configured to modify sampled data corresponding to pixels around the erroneous pixel to form an auxiliary frame, wherein the erroneous pixel is located in the auxiliary frame.

For example, a signal adjustment circuit provided by an embodiment of the present disclosure further comprises a buffer circuit, and the buffer circuit is configured to store the reference data.

At least one embodiment of the present disclosure provides an image processing circuit, comprising any signal adjustment circuit provided by the embodiments of the present disclosure and a video interface circuit, and the video interface circuit is electrically connected with the signal adjustment circuit, and is configured to analyze a received video signal into parallel display signals and provide the display signals to the signal adjustment circuit.

At least one embodiment of the present disclosure provides a display device, comprising the image processing circuit provided by the embodiments of the present disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
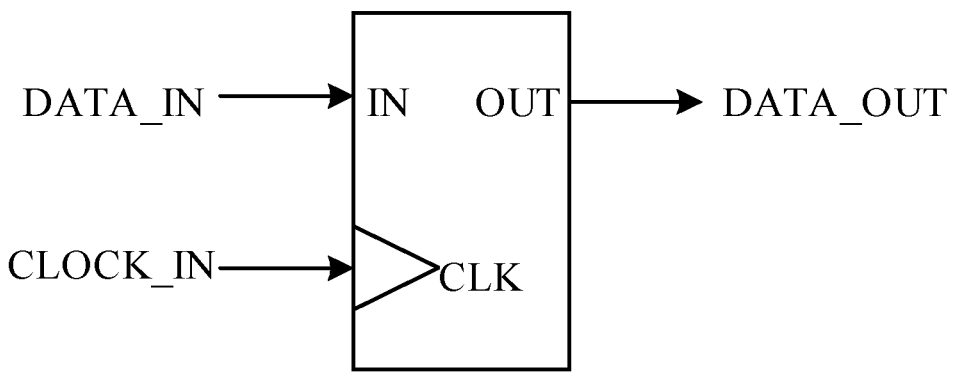
FIG. 1A is a schematic diagram of a flip-flop.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "a", "an" or "the" are not intended to indicate a limitation of quantity, but indicate a presence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

In a display system, a video signal is generally input to the display system by a video interface, for example, the video interface includes a HDMI (High Definition Multimedia Interface), a DP (DisplayPort), a DVI (Digital Visual Interface), and the like. After the video signal is input into the display system, the video signal with a high-speed is generally analyzed into parallel display signals by a video interface circuit (for example, a video interface chip). For example, the display signals include a clock signal (CLK) and a data signal (for example, includes DATA_R[9:0], DATA_G[9:0], DATA_B[9:0]), and the like. Then, a processing circuit in the display system (for example, an FPGA (Field Programmable Gate Array) processing chip or a DSP(Digital Signal Processing) processing chip) can receive the display signals and further process the display signals, for example, perform an image process, and then a display panel completes a display operation according to the processed display signals.

For example, the video interface circuit and the processing circuit in the display system are connected with each other in signal. For example, the data signal included in the display signals needs to be sampled by using the clock signal (CLK) inside the processing circuit, that is, the data signal is acquired by using a rising edge or a falling edge of the clock signal.

For example, the processing circuit may adopt an FPGA chip, and a flip-flop may be used in the FPGA chip to sample the received display signals. For example, FIG. 1A illustrates a schematic diagram of a flip-flop. As shown in FIG. 1A, the flip-flop includes a clock signal input terminal (CLK), a data signal input terminal (IN) and a data signal output terminal (OUT).

For example, in at least one embodiment of the present disclosure, the clock signal included in the display signals analyzed by the video interface circuit is referred to as an original clock signal CLOCK_IN, and the data signal included in the display signals is referred to as an original data signal DATA_IN, and the following embodiments are the same as the above about this which is not be repeated again.

As shown in FIG. 1A, the original clock signal CLOCK_IN is input to a clock signal input terminal CLK of the flip-flop, and the original data signal DATA_IN is input to a data signal input terminal IN of the flip-flop, and then the flip-flop samples the original data signal DATA_IN by using a rising edge (or a falling edge) of the original clock signal CLOCK_IN, and thus outputs a sampled data DATA_OUT at a data signal output terminal OUT.

In order to realize a correct sampling, a certain timing relationship must be satisfied between the original clock signal CLOCK_IN and the original data signal DATA_IN, that is, a sampled edge (for example, a rising edge or a falling edge) of the original clock signal CLOCK_IN is required to occur within a window period when the original data signal DATA_IN is stable (the data remains unchanged).

Figure 1B:
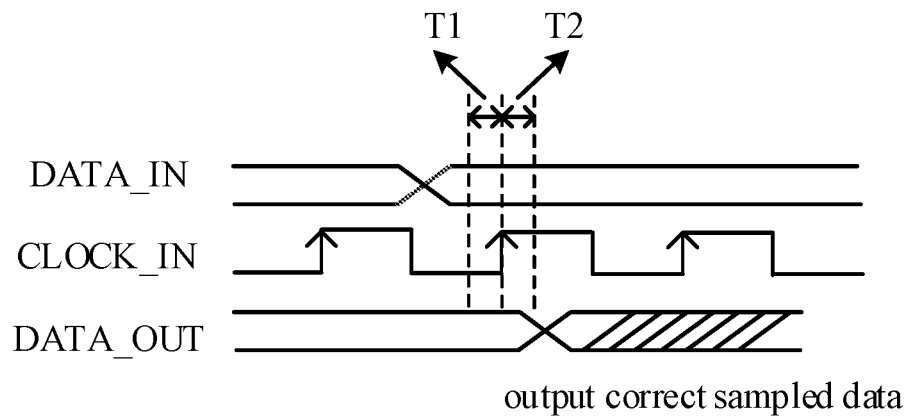
FIG. 1B is a schematic diagram of a correct sampling performed by the flip-flop illustrated in FIG. 1A.

For example, FIG. 1B illustrates a schematic diagram of a correct sampling performed by the flip-flop in FIG. 1A. As shown in FIG. 1B, a time required for data stabilization before the sampled edge (the rising edge in the example illustrated in FIG. 1B) of the original clock signal CLOCK_IN is referred to as a setup time T1, a time required for data stabilization after the sampled edge of the original clock signal CLOCK_IN is referred to as a hold time T2, and a duration between the setup time T1 and the hold time T2 is referred to as the window period. For example, as shown in FIG. 1B, the original data signal DATA_IN remains stable and unchanged during the window period, so that the sampled edge of the original clock signal CLOCK_IN can sample stable data during the window period, so that the data signal output terminal OUT of the flip-flop outputs correct sampled data.

As described above, in a case where the original clock signal CLOCK_IN and the original data signal DATA_IN output by the video interface circuit satisfy a certain timing relationship, the processing circuit at a back end performs the correct sampling. However, after the original clock signal CLOCK_IN and the original data signal DATA_IN are transmitted by different lines in the processing circuit, the timing relationship between the original clock signal CLOCK_IN and the original data signal DATA_IN may change due to different delays generated by the different lines, and thus the timing relationship between the original clock signal CLOCK_IN and the original data signal DATA_IN no longer meet the requirement of the correct sampling.

Figure 1C:
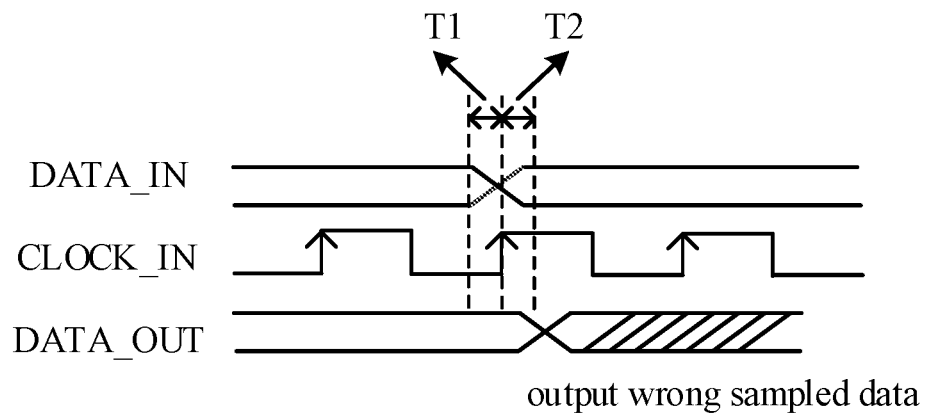
FIG. 1C is a schematic diagram of an erroneous sampling by the flip-flop illustrated in FIG. 1A.

For example, FIG. 1C shows a schematic diagram of an erroneous sampling performed by the flip-flop illustrated in FIG. 1A. As shown in FIG. 1C, during the window period for sampling, the original data signal DATA_IN no longer remains stable but changes. In this case, the flip-flop probably fails to sample correct data, and thus outputs wrong sampled data at the data signal output terminal OUT.

If the flip-flop in the processing circuit cannot correctly sample the original data signal DATA_IN, a large amount of noise may occur when the display panel subsequently adopts the data signal for the display operation. Moreover, the noise may change with changes of display images, that is, there may be many flashing pixels or pixels with color deviation on the display images, thereby affecting the display quality.

At least one embodiment of the present disclosure provides a signal adjustment method for adjusting a display signal comprising an original clock signal and an original data signal, and the method includes: delaying the original clock signal by a first delay amount to obtain a reference clock signal; delaying the original data signal by a second delay amount to obtain a reference data signal; sampling the reference data signal with the reference clock signal to obtain a sampled data; comparing the sampled data with a reference data to obtain a comparison result; and adjusting a reference timing relationship according to the comparison result, in which the reference timing relationship is a timing relationship between the reference clock signal and the reference data signal.

The signal adjustment method, a signal adjustment circuit and an image processing circuit provided by at least one embodiment of the present disclosure can adjust the timing relationship between the original clock signal and the original data signal included in the display signal, so that the timing relationship between the original clock signal and the original data signal meets the requirement of correct sampling, and thus the display panel can be prevented from having poor display defects such as noise and the like in the display operation.

Some embodiments of the present disclosure are described in detail below with reference to the attached drawings.

Figure 2:
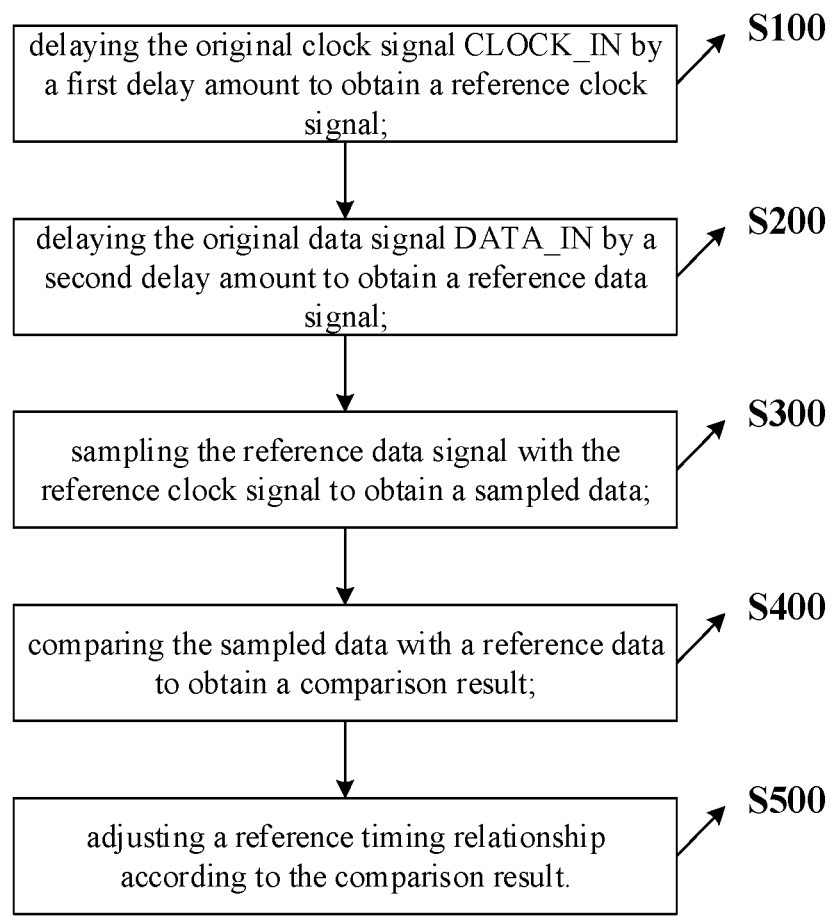
FIG. 2 is a schematic diagram of a signal adjustment method provided by some embodiments of the present disclosure.

Some embodiments of the present disclosure provide a signal adjustment method, as shown in FIG. 2, the signal adjustment method is for adjusting the display signal including the original clock signal and the original data signal. The signal adjustment method includes the following operations.

S100: delaying the original clock signal CLOCK_IN by a first delay amount to obtain a reference clock signal;

S200: delaying the original data signal DATA_IN by a second delay amount to obtain a reference data signal;

S300: sampling the reference data signal with the reference clock signal to obtain a sampled data;

S400: comparing the sampled data with a reference data to obtain a comparison result;

S500: adjusting a reference timing relationship according to the comparison result, in which the reference timing relationship is a timing relationship between the reference clock signal and the reference data signal.

For example, when a display system is in operation, a display signal corresponding to a display image is input to the display system. The display signal outputs an original clock signal CLOCK_IN and an original data signal DATA_IN after passing through a video interface circuit in the display system. The original clock signal CLOCK_ IN and the original data signal DATA_IN are supplied to the processing circuit for processing, and then are further supplied to a data driving circuit, a gate driving circuit and the like to drive the display panel to perform a display operation.

If the timing relationship between the original clock signal CLOCK_IN and the original data signal DATA_N no longer meets the requirement of correct sampling when the original clock signal CLOCK_IN and the original data signal DATA_IN reach the processing circuit after being transmitted through different wires, the display image may have the poor display problems such as noise when the display panel subsequently performs the display operation.

Before the original clock signal CLOCK_IN and the original data signal DATA_IN are supplied to the processing circuit, the above-described signal adjustment method may be applied to the original clock signal CLOCK_IN and the original data signal DATA_IN. For example, at a beginning of the signal adjustment method, both the first delay amount and the second delay amount are set to zero, that is, the original clock signal CLOCK_IN is not delay-adjusted in the step S100, and the original data signal DATA_IN is not delay-adjusted in the step S200. Of course, at the begging of the signal adjustment method, the first delay amount and the second delay amount may be set to a same non-zero value or different non-zero values, for example, both are 1 nanosecond, 2 nanosecond or other values, and no limitation is imposed to this in the embodiments of the present disclosure.

For example, in the step S400, the reference data is a pixel data corresponding to the above display image. In the step S400, the sampled data obtained in the step S300 is compared with the reference data to obtain the comparison result. For example, the display image is a simple monochrome image, and then the reference data is the pixel data corresponding to the monochrome image. For another example, the display image corresponding to the display signal is another complex image, such as a landscape image, a person image, etc. In this case, the reference data is the pixel data corresponding to the complex image. For example, an image with 4 rows and 4 columns and 16 pixels is to be displayed, and the pixel data corresponding to each of the pixels is 8 bits is taken as an example. In a case where the comparison in step S400 is performed, a one-to-one comparison is required according to data bits (4*4*8=128 bits in total). For example, in a case where the data bits corresponding to the sampled data and the data bits corresponding to the reference data are all the same, the comparison result is considered to be same, and in a case where the data bits corresponding to the sampled data and the data bits corresponding to the reference data are not all the same, the comparison result is considered to be different.

For example, in the step S500, in a case where the sampled data is same as the reference data, the reference timing relationship is not adjusted, that is, the timing relationship between the reference clock signal and the reference data signal, which are for a back-end processing circuit, satisfies the requirement of the correct sampling, so that the reference timing relationship is not adjusted again; in a case where the sampled data is different from the reference data, the reference timing relationship is adjusted. The reference timing relationship needs to be adjusted so that the timing relationship between the reference clock signal and the reference data signal can meet the requirement of the correct sampling. The adjusted reference clock signal and the reference data signal are then provided to the back-end processing circuit, so that the poor display problems such as noise can be avoided in the subsequent display operation of the display panel, thereby improving the display quality.

For example, there are two cases of timing error in the original clock signal CLOCK_IN and the original data signal DATA_IN included in the display signal: in a first error case, a timing relationship among the data bits of the original data signal DATA_IN is aligned, but the timing relationship between the original data signal DATA_IN and the original clock signal CLOCK_IN is misaligned or unknown; in a second error case, the timing relationship among the data bits of the original data signal DATA_IN is misaligned or unknown, that is, timing relationship between each of the data bits and the original clock signal CLOCK_IN is unknown.

In the signal adjustment method provided by some embodiments of the present disclosure, the above step S500 includes: keeping the second delay amount unchanged, and determining whether the first delay amount needs to be adjusted according to the comparison result. For example, in some embodiments, determining whether the first delay amount needs to be adjusted according to the comparison result includes: in a case where the sampled data is different from the reference data, increasing the first delay amount; and in a case where the sampled data is same as the reference data, storing the first delay amount at this moment as a clock target delay amount, and stopping adjusting the first delay amount.

For the first error case mentioned above, only a value of the first delay amount needs to be adjusted. For example, each time the delay adjustment is made to the reference clock signal, the delay adjustment can be performed in a unit of a minimum delay amount. For example, the minimum delay amount may be an integer multiple of 1 nanosecond, for example, the minimum delay amount includes a value of 1 nanosecond, 2 nanoseconds, or 3 nanoseconds, etc.

For example, when the above signal adjustment method is started, both the first delay amount and the second delay amount are zero nanosecond, that is, the reference clock signal and the original clock signal CLOCK_IN are identical after the step S100, and the reference data signal and the original data signal DATA_IN are identical after the step S200. Then, in the step S400, the sampled data and the reference data are compared one by one according to data bits, and comparison results of all the data bits are performed an OR operation to obtain the comparison result. For example, when comparing each of the data bits, a result of same is recorded as 0, and a result of difference is recorded as 1. If the comparison result of at least one data bit of all the data bits is 1, the final comparison result is deemed to be 1, that is, different.

If the sampled data is different from the reference data, the first delay amount is increased in the step S500, for example, the first delay amount is increased to 1 nanosecond, that is, the reference clock signal is delayed by 1 nanosecond on an original basis, then sampling and comparing are performed, if the comparison result is still different, the first delay amount is continuously increased until the comparison result becomes same, at this moment, the first delay amount is stored as a clock target delay amount, and the adjustment of the first delay amount is stopped.

After being performed the above signal adjustment method, the display system obtains the clock target delay amount. For example, when the display system is powered up again, the clock target delay amount can be directly loaded, and the delay adjustment of the original clock signal CLOCK_IN in the display signal can be adjusted using the clock target delay amount. For example, once the display system including the display panel is completed, the delay caused by each circuit in the display system to the original clock signal CLOCK_IN and the original data signal DATA_IN does not suddenly change for a long period of time, so after being performed the above signal adjustment method, the display system can automatically complete an adjustment of the signal timing, thereby avoiding the poor display problems such as noise and the like in the display operation of the display panel, and improving the display quality.

In the signal adjustment method provided by some embodiments of the present disclosure, for example, the above step S500 further includes: keeping the first delay amount unchanged, and determining whether the second delay amount needs to be adjusted according to the comparison result. For example, in some embodiments, the original data signal includes a plurality of data bits, and for each of the data bits, determining whether the second delay amount needs to be adjusted according to the comparison result includes: in a case where the sampled data is different from the reference data, increasing or decreasing the second delay amount; and in a case where the sampled data is same as the reference data, storing the second delay amount at this moment as a data target delay amount corresponding to the each of the data bits and stopping adjusting the second delay amount corresponding to the each of the data bits.

For the second error case mentioned above, the first delay amount can be kept unchanged in this case, and then a value of the second delay amount is adjusted. For example, the original data signal generally includes a plurality of data bits, and each of the data bits has a corresponding second delay amount, and in a case where the comparison result of the each of the data bits is different, the second delay amount is increased or decreased. For example, each time the delay adjustment is made to the reference data signal, the delay adjustment is performed in a unit of a minimum delay amount. For example, the minimum delay amount is an integer multiple of 1 nanosecond, for example, the minimum delay amount includes a value of 1 nanosecond, 2 nanoseconds, or 3 nanoseconds, etc.

For example, when the above signal adjustment method is performed, both the first delay amount and the second delay amount are integer multiple of the minimum delay amount, such as y*x nanoseconds, that is, the minimum delay amount is x nanoseconds, and both y and x are integers. After the step S100, the reference clock signal is delayed by y*x nanoseconds compared with the original clock signal CLOCK_IN. After the step S200, the reference data signal is delayed by y*x nanoseconds compared with the original data signal DATA_IN. Then in the step S400, the sampled data and a reference data can be compared according to the data bits one by one, in a case where a comparison result of a certain data bit is different, the second delay amount corresponding to the certain data bit is increased, for example, the second delay amount is adjusted from y*x nanoseconds to (y+1)*x nanoseconds, then the sampling and comparing are performed again, if the comparison result is still different, the second delay amount is continuously increased, for example, the second delay amount is adjusted from (y+1)*x nanoseconds to (y+2)*x nanoseconds, and then the sampling and comparing are performed again until the sampled data is same as the reference data, at this moment, the second delay amount is stored as the data target delay amount of the corresponding data bit, and the adjustment of the second delay amount corresponding to the data bit is stopped.

If the sampled data is different from the reference data all time in the above process of adjusting the second delay amount, an adjustment direction of the second delay amount is changed, for example, the second delay amount is adjusted from y*x nanoseconds to (y−1)*x nanoseconds, and then the sampling and comparing are performed again until the sampled data is same as the reference data.

When the above signal adjustment method is performed, the adjustment of the delay amount of one data bit is finished, and then the delay amount of the next data bit is adjusted until the comparison results of all the data bits are same.

After the above signal adjustment method is performed, the display system can obtain the data target delay amount corresponding to each of the data bits. For example, when the display system is powered up again, the data target delay amount can be directly loaded, and the corresponding data bit of the original data signal DATA_IN in the display signal is performed by the delay adjustment by the data target delay amount. Once the display system including the display panel is completed, the delay caused by each circuit in the display system to the original clock signal CLOCK_IN and the original data signal DATA_IN does not suddenly change for a longer period of time, so after being performed the above signal adjustment method, the display system can automatically complete an adjustment of the signal timing, thereby avoiding the poor display problems such as noise and the like in the display operation of the display panel, and improving the display quality.

Figure 3:
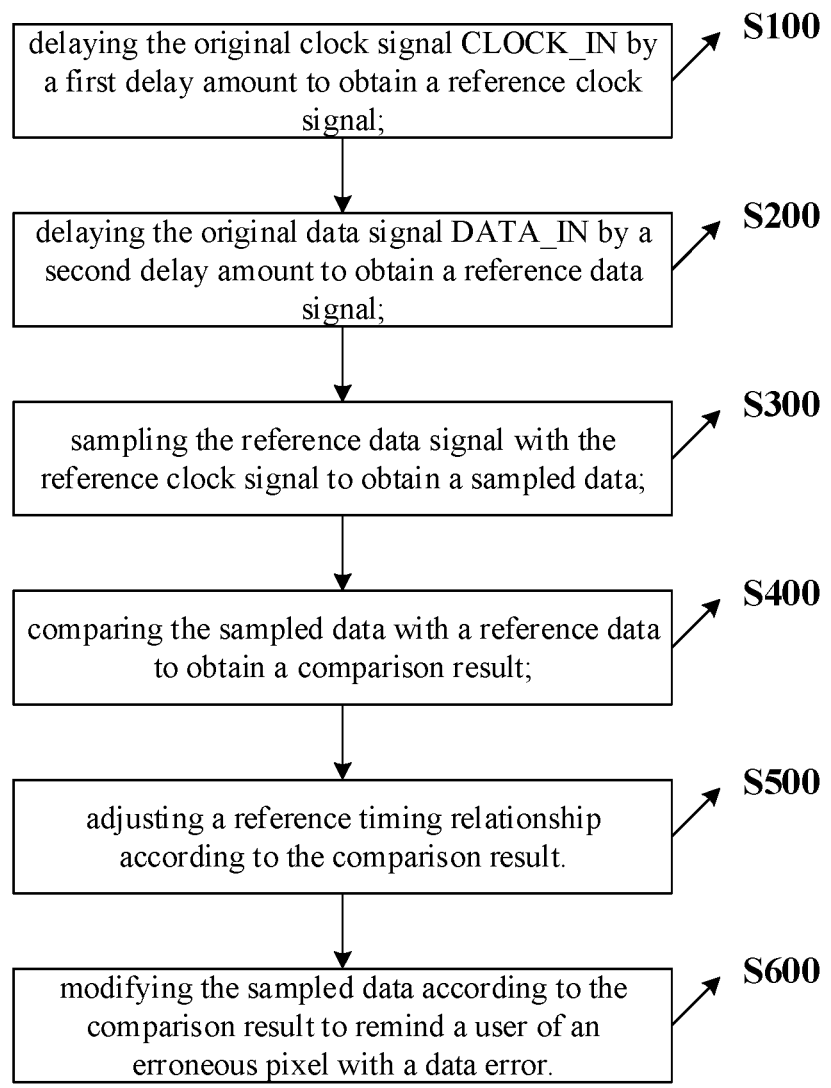
FIG. 3 is a schematic diagram of another signal adjustment method provided by some embodiments of the present disclosure.

For example, in the signal adjustment method provided by some embodiments of the present disclosure, as shown in FIG. 3, the signal adjustment method further includes the following operation.

S600: modifying the sampled data according to the comparison result to remind a user of an erroneous pixel that has a data error.

For example, if the comparison result obtained in the step S400 is different, it indicates that the sampled data corresponding to at least one pixel is erroneous at this moment, then the sampled data corresponding to the pixel where the data error occurred is modified to remind the user. For example, in the above example, and the signal adjustment method is illustrated taking a case where the pixel data corresponding to each of the pixels is an 8-bits data. If only one bit of the 8-bits data corresponding to a certain one of the pixels has a sampled error, the certain one of the pixels is caused to have a data error, for example, become noise. For example, the noise may flicker or have a color deviation.

For example, in some embodiments, modifying the sampled data according to the comparison result includes: setting all the data bits corresponding to the erroneous pixel to 1 or 0. For example, in a case where it is determined that a sampled error occurs in the sampled data corresponding to a certain pixel, all data bits (e.g., 8 data bits) corresponding to the pixel can be set to 1 (or 0), so that the pixel is modified to be a white highlighted pixel, thereby achieving the purpose of reminding the user to pay attention.

Figure 4:
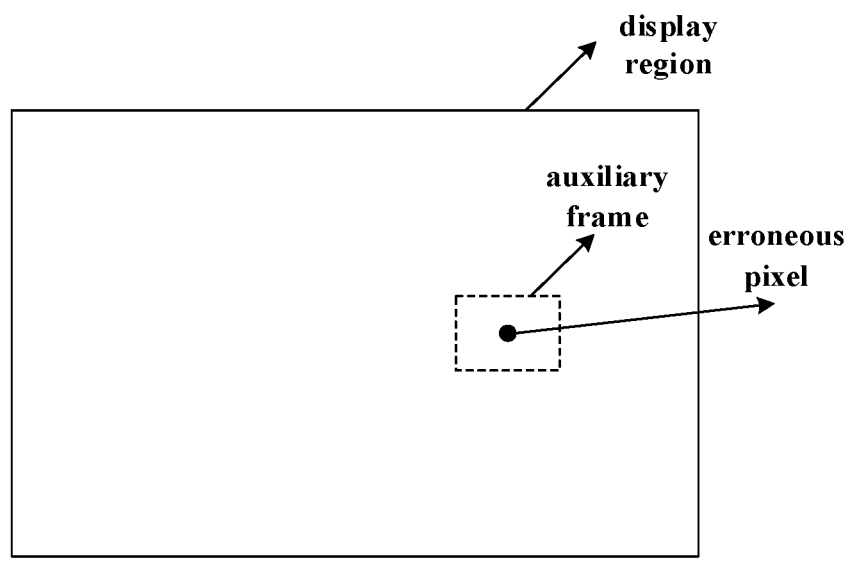
FIG. 4 is a schematic diagram of reminding an erroneous pixel in a display region.

For another example, in other embodiments, modifying the sampled data according to the comparison result includes: modifying sampled data corresponding to pixels around the erroneous pixel to form an auxiliary frame, and the erroneous pixel is located in the auxiliary frame. For example, as shown in FIG. 4, in a case where it is determined that the sampled data corresponding to a certain pixel in the display region is sampled incorrectly, the sampled data corresponding to the pixels around the erroneous pixel may be modified to form an auxiliary frame, and the auxiliary frame is used to achieve the purpose of alerting the user. It should be noted that the embodiments of the present disclosure do not limit the shape of the auxiliary frame. The auxiliary frame may be any shape such as a rectangle, a circle, or an ellipse, as long as the erroneous pixel is located in the auxiliary frame.

In the implementation of the above signal adjustment method, if the comparison result is always different, the auxiliary frame will always exist to remind the position of the erroneous pixel, and the auxiliary frame will disappear until the sampled data is same as the reference data. For example, in the process of adjusting the delay amount of the reference clock signal and the delay amount of the reference data signal, the pixel at which the sampled error occurs may change, and the auxiliary frame also changes with the position of the erroneous pixel.

Figure 5:
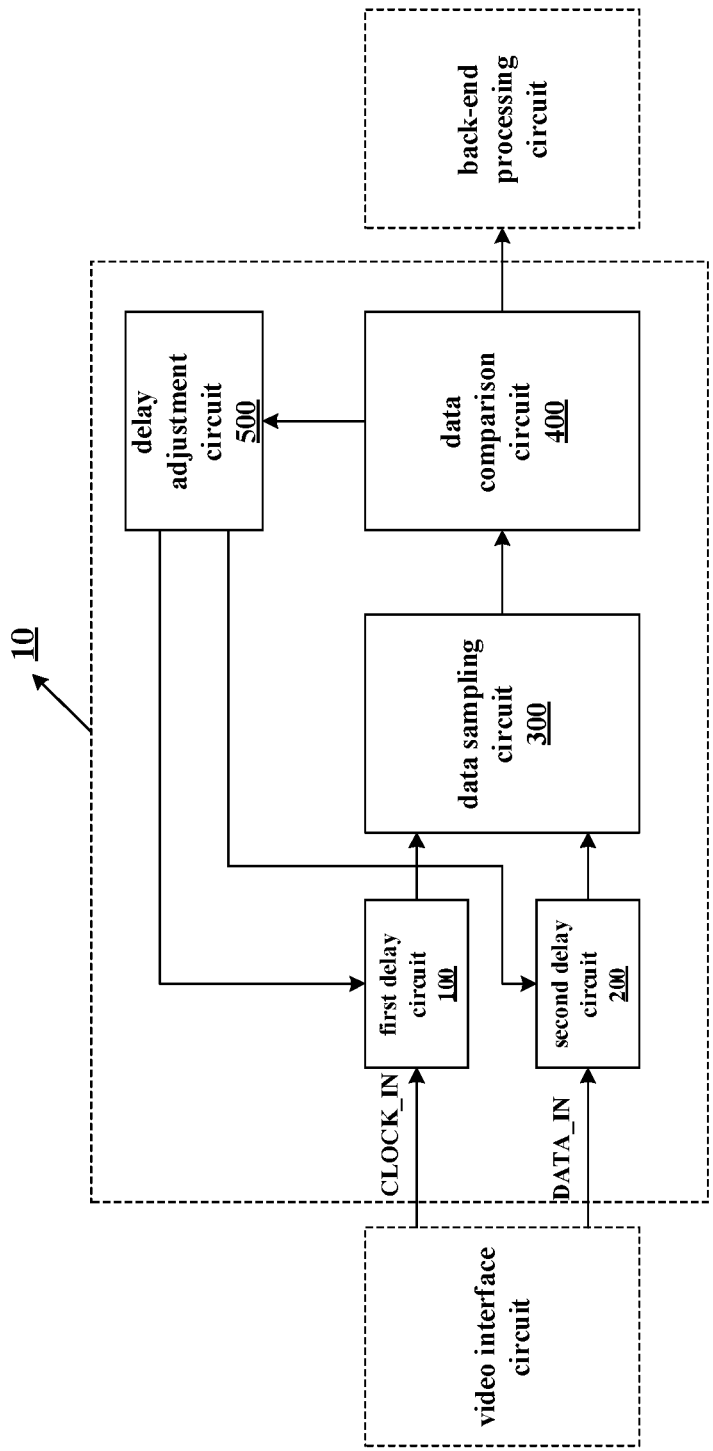
FIG. 5 is a schematic diagram of a signal adjustment circuit provided by some embodiments of the present disclosure.

Some embodiments of the present disclosure further provide a signal adjustment circuit 10 for adjusting a display signal including an original clock signal CLOCK_IN and an original data signal DATA_IN. As shown in FIG. 5, the signal adjustment circuit 10 includes a first delay circuit 100, a second delay circuit 200, a data sampling circuit 300, a data comparison circuit 400, and a delay adjustment circuit 500.

The first delay circuit 100 is configured to delay the original clock signal CLOCK_IN by a first delay amount to obtain a reference clock signal, that is, the first delay circuit 100 can perform the above-described step S100.

The second delay circuit 200 is configured to delay the original data signal DATA_IN by a second delay amount to obtain a reference data signal, that is, the second delay circuit 200 can perform the above-described step S200.

The data sampling circuit 300 is configured to sample the reference data signal with the reference clock signal to obtain sampled data, that is, the data sampling circuit 300 can perform the above-described step S300.

The data comparison circuit 400 is configured to compare the sampled data with the reference data to obtain a comparison result, that is, the data comparison circuit 400 can perform the above-described step S400.

The delay adjustment circuit 500 is configured to adjust a reference timing relationship according to the comparison result, the reference timing relationship being a timing relationship between the reference clock signal and the reference data signal. That is, the delay adjustment circuit 500 can perform the above-described step S500.

It should be noted that, regarding the operations performed by the respective circuits included in the signal adjustment circuit 10 as shown in FIG. 5, reference may be made to the corresponding description in the above-mentioned signal adjustment method, and details are not described herein again.

For example, as shown in FIG. 5, when a display system is in operation, a display signal corresponding to a display image is input to the display system, and the display signal outputs an original clock signal CLOCK_IN and an original data signal DATA_IN after passing through a video interface circuit. The original clock signal CLOCK_IN and the original data signal DATA_IN are provided to the signal adjustment circuit 10 for further adjustment such that no error occurs in the sampled data, and then the correct sampled data can be provided to the back-end processing circuit for further processing, such as image enhancement, saturation adjustment, chroma adjustment, etc., and the processed data can then be provided to the display panel for display operation.

The signal adjustment circuit 10 provided by some embodiments of the present disclosure can adjust the timing relationship between the original clock signal CLOCK_IN and the original data signal DATA_IN such that the timing relationship between the original clock signal CLOCK_IN and the original data signal DATA_IN satisfies the requirement of correct sampling, and thus the display panel can be prevented from having poor display defects such as noise and the like in the display operation.

The respective circuits included in the signal adjustment circuit 10 of FIG. 5 will be described below. For example, in a case where the signal adjustment circuit 10 is implemented by adopting an FPGA circuit board (a circuit board including an FPGA chip), the first delay circuit 100 and the second delay circuit 200 can implement the delay adjustment function by using the IDELAY device resource in the FPGA, for example, the delay of the signal passing through the DELAY device can be easily adjusted by controlling a CE an INC terminals of the IDELAY device in the FPGA. For example, the original data signal DATA_IN includes a plurality of data bits, corresponding to each of the data bits, an IDELAY device needs to be correspondingly configured to implement delay adjustment of the corresponding data bit.

For example, the data sampling circuit 300 can be implemented by adopting the flip-flop as shown in FIG. 1A. For example, the flip-flop can adopt other flip-flops having the same function, such as a D flip-flop or an RS flip-flop. For example, each data bit corresponding to the original data signal DATA_IN requires a separate flip-flop to be sampled.

It should be noted that the above-mentioned flip-flop may be implemented in a hardware manner or in a software manner, which is not limited by the embodiments of the present disclosure. For example, in a case where the signal adjustment circuit 10 is implemented as an FPGA circuit board, the function of the above flip-flop can be implemented by executing the program code stored in the FPGA circuit board by the FPGA chip in the FPGA circuit board. For example, the program code can be stored in a memory in the FPGA circuit board. When the FPGA circuit board is powered on, the FPGA chip can automatically load code pre-stored in the memory to implement the corresponding function.

Figure 6:
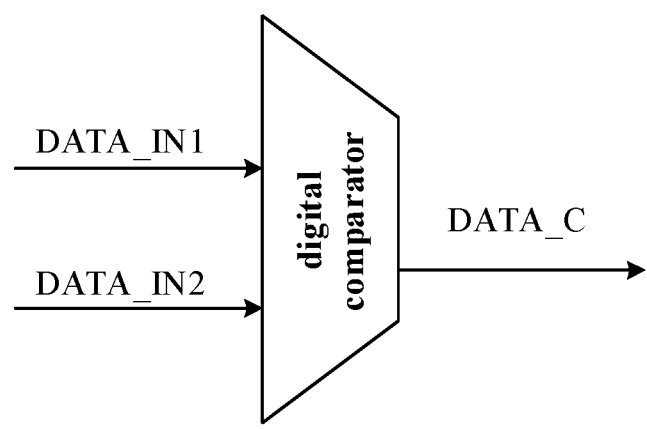
FIG. 6 is a schematic diagram of a digital comparator.

For example, in some embodiments, as shown in FIG. 6, the data comparison circuit 400 can be implemented as a plurality of digital comparators. For example, each data bit corresponding to the original data signal DATA_IN requires a separate digital comparator to implement the data comparison function. For example, as shown in FIG. 6, the delay-adjusted reference data signal is input through an input terminal DATA_IN1, and the reference data for comparison is input through an input terminal DATA_IN2, and then the comparison result is output through an output terminal DATA_C. For example, the digital comparator outputs 0 in a case where the reference data signal is identical to the corresponding data bit of the reference data, and the digital comparator outputs 1 in a case where the reference data signal is different from the corresponding data bit of the reference data.

It should be noted that the above-mentioned digital comparator may be implemented in a hardware manner or in a software manner, which is not limited in the embodiments of the present disclosure. For example, in a case where the signal adjustment circuit 10 is implemented as an FPGA circuit board, the functions of the above digital comparator can be implemented by executing the program code stored in the FPGA circuit board by the FPGA chip in the FPGA circuit board.

For example, the delay adjustment circuit 500 can be implemented by executing pre-stored program code through the FPGA chip, for example, by adopting a finite state machine (FSM) structure.

In the signal sampling circuit 10 provided by some embodiments, the delay adjustment circuit 500 is configured to keep the second delay amount unchanged and determine whether the first delay amount needs to be adjusted according to the comparison result. For example, the delay adjustment circuit 500 is configured to: in a case where the sampled data is different from the reference data, increase the first delay amount; and in a case where the sampled data is same as the reference data, store the first delay amount at this moment as a clock target delay amount and stop adjusting the first delay amount.

For example, in the first error case described above, the delay adjustment circuit 500 performs an OR operation on the comparison result of each corresponding data bit obtained by the data comparison circuit 400. In a case where the result of the OR operation is 1, the comparison result is considered to be different, the delay adjustment circuit 500 controls the first delay circuit 100 to adjust the first delay amount, for example, increases the first delay amount; and in a case where the result of the OR operation is 0, the comparison result is considered to be same, the delay adjustment circuit 500 stores the first delay amount at this time as the clock target delay amount, and stops the adjustment of the first delay amount.

In the signal adjustment circuit 10 provided by some embodiments, the delay adjustment circuit 500 is configured to keep the first delay amount unchanged and determine whether the second delay amount needs to be adjusted according to the comparison result. For example, the original data signal includes a plurality of data bits, and for each of the data bits, the delay adjustment circuit 500 is configured to increase or decrease the second delay amount in a case where the sampled data is different from the reference data; and in a case where the sampled data is same as the reference data, store the second delay amount at this moment as the data target delay amount corresponding to the each of the data bits, and stop adjusting the second delay amount corresponding to the each of the data bits.

For example, in the second error case described above, the data comparison circuit 400 has a comparison result corresponding to each of the data bits, and the delay adjustment circuit 500 can control the second delay circuit 200 according to the comparison result corresponding to the data bit. For example, in a case where the sampled data is different from the reference data, the delay adjustment circuit 500 controls the second delay circuit 200 to adjust the second delay amount corresponding to the data bit, for example, increases or decreases the second delay amount; in a case where the sampled data is same as the reference data, the delay adjustment circuit 500 stores the second delay amount at this moment as the data target delay amount of the corresponding data bit, and stops adjusting the second delay amount corresponding to the data bit.

Figure 7:
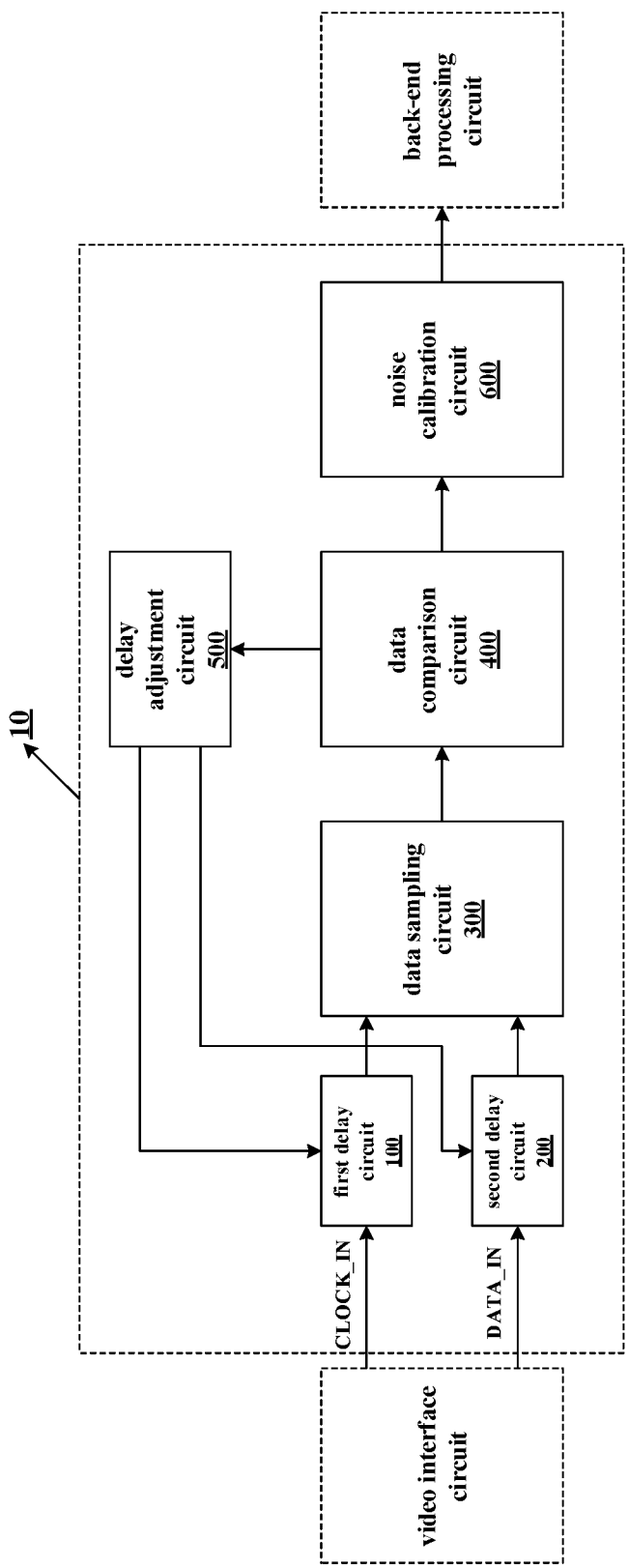
FIG. 7 is a schematic diagram of another signal adjustment circuit provided by some embodiments of the present disclosure.

As shown in FIG. 7, the signal adjustment circuit 10 provided by some embodiments of the present disclosure further includes a noise calibration circuit 600. The noise calibration circuit 600 is configured to modify the sampled data according to the comparison result to remind a user of an erroneous pixel that has a data error.

For example, if the comparison result obtained by the data comparison circuit 400 is different, it indicates that the sampled data corresponding to at least one pixel is erroneous at this moment, and then the sampled data corresponding to the pixel where the data error occurred is modified to remind the user. For example, the above example is still adopted, and the pixel data corresponding to each pixel is an 8-bits data as an example. If only one bit of the 8-bits data corresponding to a certain one of the pixels has a sampled error, the certain one of the pixels is caused to have a data error, for example, become noise. For example, the noise may flicker or have a color deviation.

For example, in some embodiments, modifying the sampled data according to the comparison result includes: setting all the data bits corresponding to the erroneous pixel to 1 or 0. For example, in a case where it is determined that a sampled error occurs in the sampled data corresponding to a certain pixel, all data bits (for example, 8 data bits) corresponding to the pixel can be set to 1 (or 0), so that the pixel is modified to be a white highlighted pixel, thereby achieving the purpose of reminding the user to pay attention.

For another example, in other embodiments, modifying the sampled data according to the comparison result includes: modifying sampling data corresponding to pixels around the erroneous pixel to form an auxiliary frame, and the erroneous pixel is located in the auxiliary frame. For example, as shown in FIG. 4, in a case where it is determined that the sampled data corresponding to a certain pixel is sampled incorrectly, the sampled data corresponding to the pixels around the erroneous pixel may be modified to form an auxiliary frame, and the auxiliary frame is used to achieve the purpose of alerting the user. It should be noted that the embodiments of the present disclosure do not limit the shape of the auxiliary frame, and the auxiliary frame may be any shape such as a rectangle, a circle, or an ellipse, as long as the erroneous pixel is located in the auxiliary frame.

Figure 8:
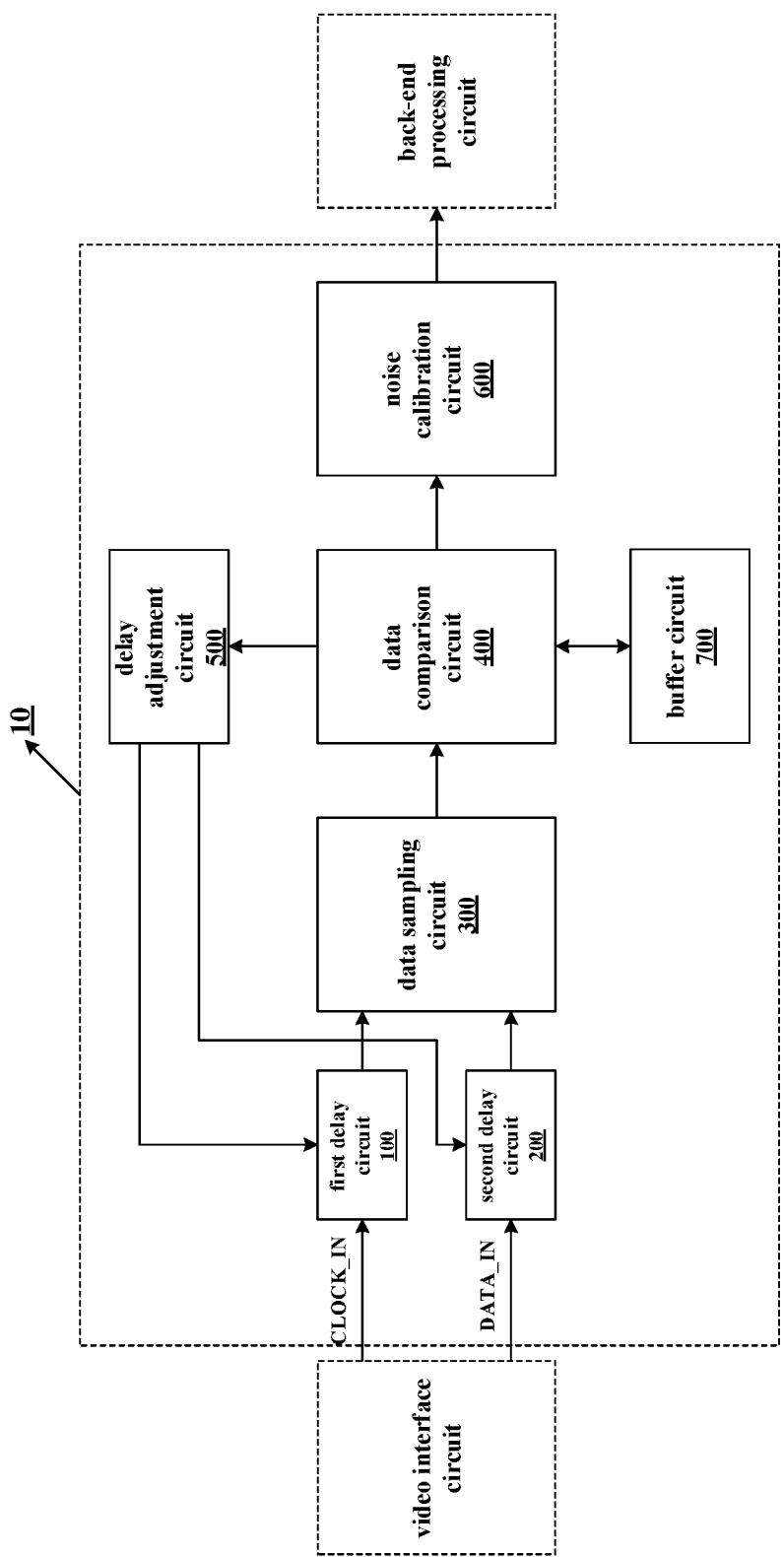
FIG. 8 is a schematic diagram of further another signal adjustment circuit provided by some embodiments of the present disclosure.

As shown in FIG. 8, the signal adjustment circuit 10 provided by some embodiments of the present disclosure further includes a buffer circuit 700, and the buffer circuit 700 is configured to store the reference data. For example, in some embodiments, the buffer circuit 700 can include non-volatile memory and volatile memory. For example, the reference data is stored in the non-volatile memory. When the signal adjustment circuit 10 is powered up, the reference data can be read from the non-volatile memory, and be written into the volatile memory. Then the reference data can be read from the volatile memory in real when the data comparison circuit 400 is operating. For example, the non-volatile memory can adopt an SD card memory, and the volatile memory can adopt a DDR3 memory. In this way, the real-time requirements can be better met.

Figure 9:
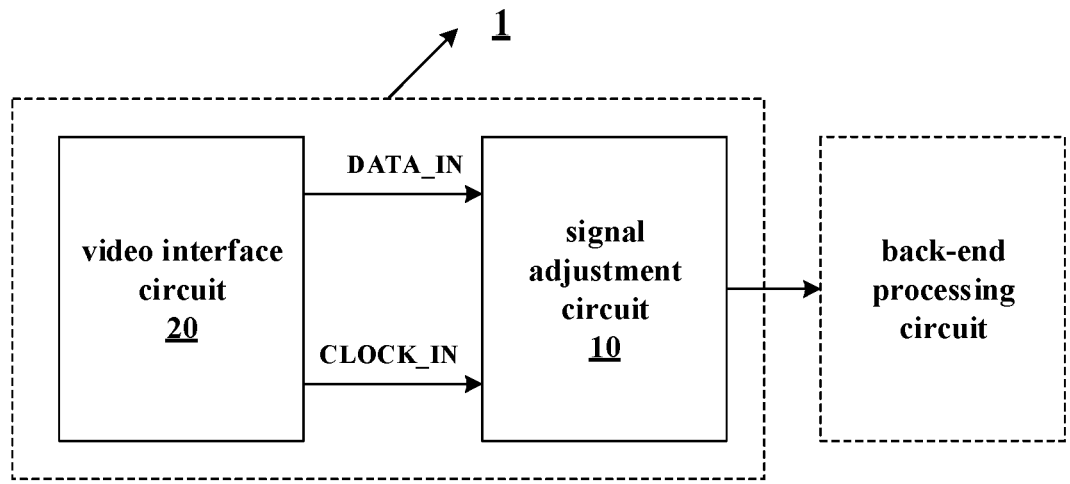
FIG. 9 is a schematic diagram of an image processing circuit provided by some embodiments of the present disclosure.

Some embodiments of the present disclosure also provide an image processing circuit 1, as shown in FIG. 9, the image processing circuit 1 includes a signal adjustment circuit 10 and a video interface circuit 20. The signal adjustment circuit 10 can adopt any of the signal adjustment circuits 10 provided by embodiments of the present disclosure. For example, the video interface circuit 20 can adopt a video interface chip.

As shown in FIG. 9, the video interface circuit 20 is electrically coupled to the signal adjustment circuit 10, and is configured to analyze a received video signal into parallel display signals and provide the display signals to the signal adjustment circuit 10. The signal adjustment circuit 10 can then make signal adjustment to the display signal such that the correct sampling requirements are met, and then the signal adjustment circuit 10 provides the adjusted display signal to a back-end processing circuit for further data processing. For example, the back-end processing circuit may include a data processing circuit, and a gate driving circuit and a data driving circuit which are for driving the display panel to perform the display operation. For example, the adjusted display signal can be further processed by the data processing circuit to achieve image enhancement, saturation adjustment, or chroma adjustment.

The image processing circuit 1 provided by the embodiment of the present disclosure can adjust the timing relationship of the display signal to meet the requirements of correct sampling, thereby avoiding display defects such as noise in the display operation of the display panel.

Figure 10:
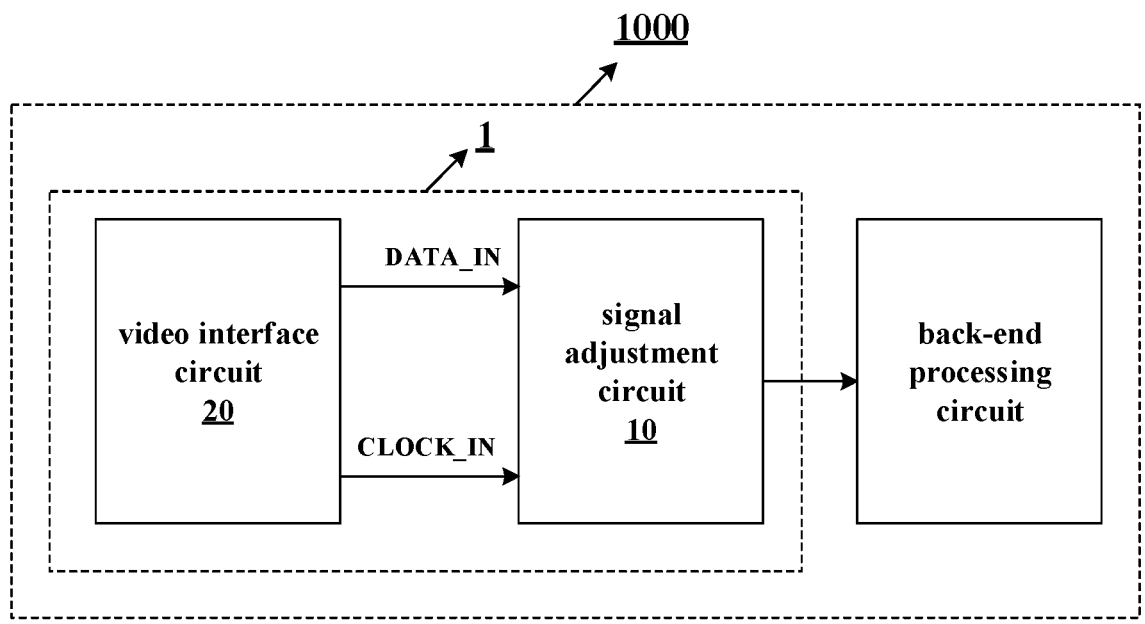
FIG. 10 is a schematic diagram of a display device provided by some embodiments of the present disclosure.

Some embodiments of the present disclosure further provide a display device 1000, as shown in FIG. 10, the display device 1000 includes an image processing circuit 1 provided by an embodiment of the present disclosure and a back-end processing circuit. For example, the display signal adjusted by the signal adjustment circuit 10 is provided to the back-end processing circuit for further data processing. For example, the display device 1000 may further include a display panel, and the display signal processed by the back-end processing circuit is supplied to the display panel to perform a display operation.

It should be noted that the display device 1000 provided by some embodiments of the present disclosure can be a liquid crystal panel, a liquid crystal television, a display, an OLED panel, an OLED television, an electronic paper, a mobile phone, a tablet computer, a notebook computer, a digital photo frame, a navigator and other products or members having display function.

The technical effects of the display device 1000 provided in the embodiments of the present disclosure can refer to the corresponding descriptions of the signal adjustment circuit 10 in the above embodiments, and details are not described here again.

What have been described above are only specific implementations of the present disclosure, the protection scope of the present disclosure is not limited thereto. The protection scope of the present disclosure should be based on the protection scope of the claims.

What is claimed is:

1. A signal adjustment method for adjusting a display signal comprising an original clock signal and an original data signal, comprising:
   delaying the original clock signal by a first delay amount to obtain a reference clock signal;
   delaying the original data signal by a second delay amount to obtain a reference data signal;
   sampling the reference data signal with the reference clock signal to obtain a sampled data;
   comparing the sampled data with a reference data to obtain a comparison result; and
   adjusting a reference timing relationship according to the comparison result,
   wherein the reference timing relationship is a timing relationship between the reference clock signal and the reference data signal.

2. The signal adjustment method according to claim 1, wherein adjusting the reference timing relationship according to the comparison result comprises:
   keeping the second delay amount unchanged, and determining whether the first delay amount needs to be adjusted according to the comparison result.

3. The signal adjustment method according to claim 2, wherein determining whether the first delay amount needs to be adjusted according to the comparison result comprises:
   in a case where the sampled data is different from the reference data, increasing the first delay amount; and
   in a case where the sampled data is same as the reference data, storing the first delay amount at this moment as a clock target delay amount, and stopping adjusting the first delay amount.

4. The signal adjustment method according to claim 2, wherein comparing the sampled data with the reference data to obtain the comparison result comprises:
   comparing the sampled data and the reference data one by one according to data bits, and performing an OR operation on comparison results of all the data bits to obtain the comparison result.

5. The signal adjustment method according to claim 1, wherein adjusting the reference timing relationship according to the comparison result comprises:
   keeping the first delay amount unchanged, and determining whether the second delay amount needs to be adjusted according to the comparison result.

6. The signal adjustment method according to claim 5, wherein the original data signal comprises a plurality of data bits, and for each of the data bits, determining whether the second delay amount needs to be adjusted according to the comparison result comprises:
   in a case where the sampled data is different from the reference data, increasing or decreasing the second delay amount; and
   in a case where the sampled data is same as the reference data, storing the second delay amount at this moment as a data target delay amount corresponding to the each of the data bits and stopping adjusting the second delay amount corresponding to the each of the data bits.

7. The signal adjustment method according to claim 6, wherein increasing or decreasing the second delay amount comprises:
   increasing or decreasing the second delay amount by a minimum delay amount.

8. The signal adjustment method according to claim 6, wherein if the sampled data is different from the reference data all time, an adjustment direction of the second delay amount is changed.

9. The signal adjustment method according to claim 1, further comprising: modifying the sampled data according to the comparison result to remind a user of an erroneous pixel that has a data error.

10. The signal adjustment method according to claim 9, wherein modifying the sampled data according to the comparison result comprises:
    setting all data bits corresponding to the erroneous pixel to 1 or 0.

11. The signal adjustment method according to claim 9, wherein modifying the sampled data according to the comparison result comprises:

modifying sampled data corresponding to pixels around the erroneous pixel to form an auxiliary frame, wherein the erroneous pixel is located in the auxiliary frame.

12. A signal adjustment circuit used for adjusting a display signal comprising an original clock signal and an original data signal, comprising a first delay circuit, a second delay circuit, a data sampling circuit, a data comparison circuit and a delay adjustment circuit,
wherein the first delay circuit is configured to delay the original clock signal by a first delay amount to obtain a reference clock signal;
the second delay circuit is configured to delay the original data signal by a second delay amount to obtain a reference data signal;
the data sampling circuit is configured to sample the reference data signal with the reference clock signal to obtain a sampled data;
the data comparison circuit is configured to compare the sampled data with a reference data to obtain a comparison result; and
the delay adjustment circuit is configured to adjust a reference timing relationship according to the comparison result,
wherein the reference timing relationship is a timing relationship between the reference clock signal and the reference data signal.

13. The signal adjustment circuit according to claim 12, wherein the delay adjustment circuit is configured to keep the second delay amount unchanged and determine whether the first delay amount needs to be adjusted according to the comparison result.

14. The signal adjustment circuit according to claim 13, wherein the delay adjustment circuit is configured to, in a case where the sampled data is different from the reference data, increase the first delay amount; and
in a case where the sampled data is same as the reference data, store the first delay amount at this moment as a clock target delay amount and stop adjusting the first delay amount.

15. The signal adjustment circuit according to claim 12, wherein the delay adjustment circuit is configured to keep the first delay amount unchanged and determine whether the second delay amount needs to be adjusted according to the comparison result.

16. The signal adjustment circuit according to claim 15, wherein the original data signal comprises a plurality of data bits, and for each of the data bits, the delay adjustment circuit is configured to,
in a case where the sampled data is different from the reference data, increase or decrease the second delay amount; and
in a case where the sampled data is same as the reference data, store the second delay amount at this moment as a data target delay amount corresponding to the each of the data bits and stop adjusting the second delay amount corresponding to the each of the data bits.

17. The signal adjustment circuit according to claim 12, further comprising a noise calibration circuit,
wherein the noise calibration circuit is configured to modify the sampled data according to the comparison result to remind a user of an erroneous pixel that has a data error.

18. The signal adjustment circuit according to claim 17, wherein the noise calibration circuit is configured to modify sampled data corresponding to pixels around the erroneous pixel to form an auxiliary frame, wherein the erroneous pixel is located in the auxiliary frame.

19. An image processing circuit, comprising the signal adjustment circuit according to claim 12 and a video interface circuit,
wherein the video interface circuit is electrically connected with the signal adjustment circuit, and is configured to analyze a received video signal into parallel display signals and provide the display signals to the signal adjustment circuit.

20. A display device, comprising the image processing circuit according to claim 19.

* * * * *